(12) United States Patent
Liu

(10) Patent No.: US 11,087,985 B2
(45) Date of Patent: Aug. 10, 2021

(54) MANUFACTURING METHOD OF TFT ARRAY SUBSTRATE

(71) Applicant: Shenzhen China Star Optoelectronics Technology Co., Ltd., Shenzhen (CN)

(72) Inventor: Xiaodi Liu, Shenzhen (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 388 days.

(21) Appl. No.: 16/319,349

(22) PCT Filed: Dec. 11, 2018

(86) PCT No.: PCT/CN2018/120399
§ 371 (c)(1),
(2) Date: Jan. 21, 2019

(87) PCT Pub. No.: WO2020/073474
PCT Pub. Date: Apr. 16, 2020

(65) Prior Publication Data
US 2021/0183912 A1 Jun. 17, 2021

(30) Foreign Application Priority Data
Oct. 11, 2018 (CN) .......................... 201811185499.2

(51) Int. Cl.
*H01L 21/033* (2006.01)
*H01L 27/12* (2006.01)
(Continued)

(52) U.S. Cl.
CPC ........ *H01L 21/0337* (2013.01); *H01L 21/033* (2013.01); *H01L 21/0334* (2013.01);
(Continued)

(58) Field of Classification Search
CPC . H01L 27/1288; H01L 27/127; H01L 27/124; H01L 21/3065; H01L 21/3086;
(Continued)

(56) References Cited

U.S. PATENT DOCUMENTS

| | | | | |
|---|---|---|---|---|
| 2001/0035527 | A1* | 11/2001 | Tanaka | .............. H01L 29/66765 257/59 |
| 2004/0180480 | A1* | 9/2004 | Dejima | ............. H01L 29/42384 438/161 |

(Continued)

FOREIGN PATENT DOCUMENTS

| | | |
|---|---|---|
| CN | 104517896 A | 4/2015 |
| CN | 106684037 A | 5/2017 |

(Continued)

*Primary Examiner* — Eduardo A Rodela
(74) *Attorney, Agent, or Firm* — Leong C. Lei

(57) ABSTRACT

The invention provides a manufacturing method of the TFT array substrate. Compared to existing 4M process, the invention changes the structural design of the semi-transmissive mask for the photoresist layer for patterning the source/drain metal layer and the semiconductor layer. The edge forms a reduced thickness edge portion, so that the edge of the photoresist layer is thinned, and thereby the width of the photoresist layer is easily reduced in subsequent processes, and the semiconductor layer at the edge of the metal wire structure is easily etched during dry etching, reducing the tailing problem of the active layer at edges of source/drain to achieve finer metal wire structure, and improve optical stability, electrical performance, aperture ratio, reliability, power consumption, and the overall performance of the TFT array substrate. The residual problem of amorphous and heavily doped silicon on source/drain edge in original process is solved or reduced.

10 Claims, 5 Drawing Sheets

(51) Int. Cl.
*H01L 21/308* (2006.01)
*H01L 21/3213* (2006.01)
*H01L 21/311* (2006.01)
*H01L 21/4763* (2006.01)
*H01L 21/467* (2006.01)
*H01L 21/4757* (2006.01)
*H01L 21/3065* (2006.01)

(52) U.S. Cl.
CPC ...... *H01L 21/0338* (2013.01); *H01L 21/3088* (2013.01); *H01L 27/124* (2013.01); *H01L 27/127* (2013.01); *H01L 27/1288* (2013.01); *H01L 21/3065* (2013.01); *H01L 21/3086* (2013.01); *H01L 21/31138* (2013.01); *H01L 21/32134* (2013.01); *H01L 21/32139* (2013.01); *H01L 21/467* (2013.01); *H01L 21/47573* (2013.01); *H01L 21/47635* (2013.01); *H01L 27/1225* (2013.01)

(58) Field of Classification Search
CPC ............. H01L 21/32139; H01L 21/467; H01L 27/1225; H01L 21/31138; H01L 21/47635; H01L 21/32134; H01L 21/47573; H01L 27/1214; H01L 27/1259; H01L 27/1262; H01L 27/1296; H01L 2021/775; H01L 21/027; H01L 21/033; H01L 21/0334; H01L 21/0337; H01L 21/0338; H01L 21/308; H01L 21/3081; H01L 21/3083; H01L 21/3088

See application file for complete search history.

(56) References Cited

U.S. PATENT DOCUMENTS

| | | | |
|---|---|---|---|
| 2010/0320464 | A1 | 12/2010 | Chang et al. |
| 2015/0279916 | A1* | 10/2015 | Takamaru ........... H01L 51/5206 257/40 |
| 2016/0322401 | A1* | 11/2016 | Zhang .................. H01L 27/124 |
| 2018/0308879 | A1* | 10/2018 | Liu ...................... H01L 27/1288 |
| 2018/0308880 | A1* | 10/2018 | Liu ........................ H01L 27/127 |
| 2019/0206902 | A1* | 7/2019 | Zhou ................. H01L 29/66765 |

FOREIGN PATENT DOCUMENTS

| | | |
|---|---|---|
| CN | 106684038 A | 5/2017 |
| CN | 108231553 A | 6/2018 |

* cited by examiner

MANUFACTURING METHOD OF TFT ARRAY SUBSTRATE

BACKGROUND OF THE INVENTION

1. Field of the Invention

The present invention relates to the field of display, and in particular to a manufacturing method of thin film transistor (TFT) array substrate.

2. The Related Arts

In the field of display technology, the panel display devices such as liquid crystal display (LCD) and active matrix organic light-emitting diode (AMOLED) displays have been widely used due to the advantages such as thinness, high image quality, power saving, and radiation-free, in a wide range of applications such as mobile phones, personal digital assistants (PDAs), digital cameras, computer screens or notebook screens.

The TFT array substrate is the main component of known LCD devices and AMOLED devices, which is directly related to the development trend of high-performance panel display devices, and is used to provide driving circuits to displays. The TFT array substrates are usually disposed with a plurality of scan lines and a plurality of data lines, the plurality of scan lines and the plurality of data lines define a plurality of pixel units, and each of the pixel units is provided with a TFT and a pixel electrode, with the gate of the TFT connected to the corresponding scan line. When the voltage on the scan line reaches the turn-on voltage, the source and drain of the TFT are conductive, thereby inputting the data voltage on the data line to the pixel electrode, and controlling the display of the corresponding pixel area.

In the semiconductor mass production, the photo equipment is the core and the most expensive equipment, so the production capacity of the mass production is based on the photo equipment. Also, excessive use of masks in exposure will increase the cost as well as the tact time, thereby reducing the production efficiency. Therefore, throughout the development of the semiconductor industry, the number of exposures using the masks is cut down, the production capacity is increased, and the cost is reduced. In the process of TFT array substrate, four-masks (4M) processes replace the five-masks (5M) processes for the industry's R&D and process trends. In the 4M process, a problem exists in that the second metal edge has an amorphous silicon and a heavily doped silicon residue, and the second metal is the source/drain metal. This problem affects TFT optical stability and electrical performance, aperture ratio, power consumption and reliability, which is due to the use of a halftone mask (HTM) or gray-tone mask (GTM) patterning process, as shown in FIG. 1.

Refer to FIG. 2. FIG. 2 is a schematic view of a conventional 4M process, showing a second mask process in the 4M process. The conventional 4M processes generally comprise:

In the first mask process, a gate layer 12 is formed on a glass substrate 11, and the gate layer 12 is patterned; then a gate insulating layer 13, an active layer, a source/drain layer 16, and a photoresist layer 17 are formed. The active layer may comprise a channel layer 14, a contact layer 15;

In the second mask process, the second mask in this example is a gray-tone mask, as shown in FIG. 1, and the gray-tone mask has a light-shielding source-drain pattern 22 and a semi-transmissive channel region pattern 23. The photoresist layer 17 is exposed and developed by using the gray-tone mask; a first wet etching, patterning the source/drain layer 16, corresponding to the source/drain pattern 22 and the channel region pattern 23, and forming source and drain regions and a metal wire structure of an active region; a first dry etching, corresponding to the source/drain pattern 22 and the channel region pattern 23, forming an active layer island structure, that is, the patterned channel layer 14 and the contact layer 15; oxygen ashing, reducing the thickness of the photoresist layer 17 to expose the source/drain layers 16 of the channel region; a second wet etching, patterning the source and the drain; a second etching, etching the active layer, that is, etching the channel layer 14 and the contact layer 15 to form a TFT structure;

In the third mask process, forming a passivation layer and patterning the passivation layer;

In the fourth mask process, forming a transparent electrode layer and patterning the transparent electrode layer.

For the problem existing in the second metal edge in the known 4M process having the residual amorphous silicon (channel layer 14) and the heavily doped silicon (contact layer 15), a method for preparing a TFT array for optimizing the 4M process is needed.

SUMMARY OF THE INVENTION

The object of the present invention is to provide a manufacturing method of TFT array substrate. By thinning the edge of the photoresist layer, the semiconductor layer at the edge of the metal wiring structure is easily etched, thereby alleviating the problem of tailing of the active layer at the source and drain edges.

To achieve the above object, the present invention provides a manufacturing method of TFT array substrate, comprising the following steps:

Step S1, providing a base substrate, forming a gate, a gate insulating layer, a semiconductor layer, and a source/drain metal layer on the base substrate;

Step S2, providing a half-transmissive mask, coating a photoresist material on the source/drain metal layer, exposing and developing the photoresist material by using the semi-transmissive mask to obtain a photoresist layer, the photoresist layer comprising a first photoresist pattern, a second photoresist pattern, and a third photoresist pattern spaced apart from each other; the first photoresist pattern, the second photoresist pattern, and the third photoresist pattern each comprising a center portion and an edge portion on two sides of the center portion; the center portion of the first photoresist pattern being disposed with a groove; the edge portion having a thickness smaller than the center portion; the center portion corresponding to subsequently formed source and drain; the edge portion corresponding to a subsequently formed semiconductor layer at edge of metal wire structure; the groove corresponding to a subsequently formed channel;

Step S3, performing a first wet etching, forming a metal wire structure from the source/drain metal layer;

Step S4, performing a first dry etching, forming an active layer structure from the semiconductor layer;

Step S5, performing ashing treatment on the photoresist layer to reduce the thickness of the photoresist layer such that the groove is converted to a through hole which exposes an upper surface of the metal wire structure;

Step S6, performing a second wet etching, forming a source and a drain from the metal wire structure;

Step S7: performing a second dry etching to form a channel on the active layer structure to obtain an active layer to form a TFT structure.

The semi-transmissive mask has a first pattern, a second pattern, and an edge pattern, wherein the second pattern is continuous with the first pattern, and the edge pattern is disposed continuously along an edge of the first pattern;

in the step S2, the first pattern, the second pattern, and the edge pattern are respectively used to form the center portion, the groove, and the edge portion;

the photoresist material provided in the step S2 is a positive photoresist material, the first pattern of the semi-transmissive mask is an opaque region, and the second pattern and the edge pattern are semi-transmissive regions.

The semi-transmissive mask is a halftone mask.

The semi-transmissive mask is a gray-tone mask, and the edge pattern of the semi-transmissive mask has a light transmittance of 30% to 50%.

The center portion of the photoresist layer formed in the step S2 has two or more connected photoresist strips, and a portion of the semi-transmissive mask where corresponding to the adjacent two photoresist strips are connected is a first pattern or edge pattern.

The step S3 further comprises: performing ashing treatment on the photoresist layer after the first wet etching and before the first dry etching to reduce width of the photoresist layer, so that the semiconductor layer at edge of the metal wire structure is easily etched;

the step S6 further comprises: performing ashing treatment on the photoresist layer after the second wet etching and before the second dry etching to reduce the width of the photoresist layer, so that the semiconductor layer at edge of the metal wire structure is easily etched.

The semiconductor layer comprises a channel layer and a contact layer disposed on the channel layer.

The channel layer and the contact layer are formed by plasma enhanced chemical vapor deposition, sol-gel, sputtering, or atomic layer deposition.

Material of the channel layer and the contact layer is an amorphous silicon or a metal oxide semiconductor.

The TFT structure obtained in the step S5 is a TFT structure of an active area or a gate driver on array (GOA) area.

The present invention provides the following advantages: the manufacturing method of the TFT array substrate of the present invention is different from the existing 4M process by changing the structural design of the semi-transmissive mask for the photoresist layer for patterning the source/drain metal layer and the semiconductor layer. The edge forms a reduced thickness edge portion, so that the edge of the photoresist layer is thinned, and thereby the width of the photoresist layer is easily reduced in subsequent processes, and the semiconductor layer at the edge of the metal wire structure is easily etched during dry etching, reducing the problem of tailing of the active layer at the edges of source and drain to achieve a finer metal wire structure, and improve the optical stability and electrical performance of the TFT, aperture ratio, reliability, and power consumption, and the overall performance of the TFT array substrate. The residual problem of amorphous silicon and heavily doped silicon on the source/drain edge in the original process may be solved or reduced.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 6:
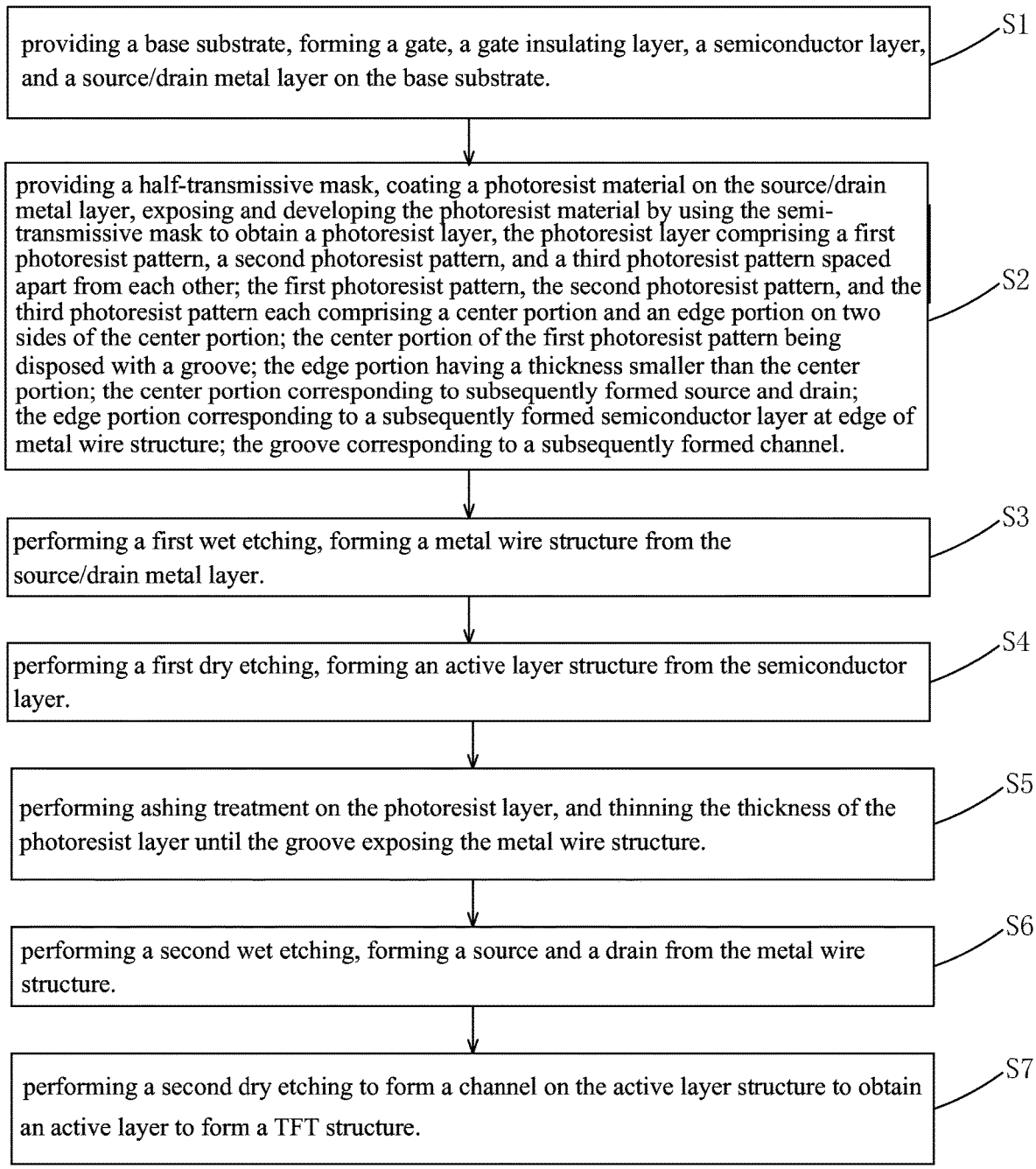
FIG. 6 is a schematic view showing the flow chart of a manufacturing method of TFT array substrate according to the present invention.

Refer to FIG. 6. The present invention provides a manufacturing method of TFT array substrate, which comprises the following steps:

Step S1, providing a base substrate 10, forming a gate 20, a gate insulating layer 30, a semiconductor layer 40, and a source/drain metal layer 50 on the base substrate 10.

Step S2, providing a half-transmissive mask 90, coating a photoresist material on the source/drain metal layer 50, exposing and developing the photoresist material by using the semi-transmissive mask 90 to obtain a photoresist layer 80, the photoresist layer comprising a first photoresist pattern 81, a second photoresist pattern 82, and a third photoresist pattern 83; the first photoresist pattern 81, the second photoresist pattern 82, and the third photoresist pattern 83 each comprising a center portion 811 and an edge portion 812 on two sides of the center portion 811; the center portion 811 of the first photoresist pattern 81 being disposed with a groove 813; the edge portion 812 having a thickness smaller than the center portion 811; the center portion 811 corresponding to subsequently formed source/drain 55; the edge portion 812 corresponding to a subsequently formed semiconductor layer 40 at edge of metal wire structure 54; the groove 813 corresponding to a subsequently formed channel; that is, the edge of the photoresist layer 80 is thinned by the semi-transmissive mask 90, so that the width of the photoresist layer 80 is easily reduced in subsequent processes, thereby making the semiconductor layer 40 at the edge of the metal wire structure 54 easy to be dry etched by the plasma.

Step S3, performing a first wet etching, forming a metal wire structure 54 from the source/drain metal layer 50.

Step S4, performing a first dry etching, forming an active layer structure 44 from the semiconductor layer 40.

Step S5, performing ashing treatment on the photoresist layer 80 to reduce the thickness of the photoresist layer 80 such that the groove 813 is converted to a through hole which exposes an upper surface of the metal wire structure 514.

Step S6, performing a second wet etching, forming a source/drain 55 from the metal wire structure 54.

Step S7: performing a second dry etching to form a channel on the active layer structure 44 to obtain an active layer 45 to form a TFT structure.

The present invention specifically relates to an optimized 4M process backplane development used for TFT array in active area and GOA circuit area and circuit performance optimization.

Specifically, in the step S1, the gate 20 is patterned by using the first mask process. The semi-transmissive mask 90 used in the step S2 is the second mask, and the steps S2 to S7 are the second mask process patterning the semiconductor layer 40 and the source/drain metal layer 50 to form an active layer 45 and source/drain 55. The manufacturing method of TFT array substrate of the present invention further comprises a step S8 to form a passivation layer covering the TFT structure, and patterning the passivation layer by the third mask process to form a contact via exposing the source/drain 55; and a step S9 to form a transparent electrode layer on the passivation layer, and patterned by the fourth mask process to form a pixel electrode, and the pixel electrode being in contact with the source/drain 55 through the contact via.

Specifically, the gate 20 can be formed by sputtering, sol-gel, atomic layer deposition, evaporation, printing, etc., and the material thereof can be Cu, Cu/Mo, Mo/Cu/Mo, MoNb/Cu/MoNb, Ti/Cu/Ti, Al, Al/Mo, Mo/Al/Mo and other electrode materials.

Specifically, the gate insulating layer 30 can be formed by a method such as plasma chemical vapor deposition, atmospheric pressure chemical vapor deposition, sputtering, and so on, and uses dielectric materials, such as silicon nitride, silicon oxide, silicon oxynitride, aluminum oxide, hafnium oxide, and so on.

Specifically, the semiconductor layer 40 may comprise a channel layer 41 and a contact layer 42 disposed on the channel layer 41. The channel layer 41 and the contact layer 42 can be formed by methods such as plasma enhanced chemical vapor deposition, sol-gel, sputtering or atomic layer deposition. The material of the channel layer 41 and the contact layer 42 is an amorphous silicon or a metal oxide semiconductor such as IGZO, IZO, ITZO, and so on.

Specifically, regarding the passivation layer deposition, the contact via etching, and the transparent electrode layer such as ITO routing, the prior art may be employed, and details are not described herein.

Specifically, the semi-transmissive mask 90 has a first pattern 91, a second pattern 92, and an edge pattern 93, wherein the second pattern 92 is continuous with the first pattern 91, and the edge pattern 93 is disposed continuously along an edge of the first pattern 91; in the step S2, the first pattern 91, the second pattern 92, and the edge pattern 93 are respectively used to form the center portion 811, the groove 813, and the edge portion 812.

Specifically, the photoresist material provided in the step S2 is a positive photoresist material, the first pattern 91 of the semi-transmissive mask 90 is an opaque region, and the second pattern 92 and the edge pattern 93 are semi-transmissive regions.

Figure 1:
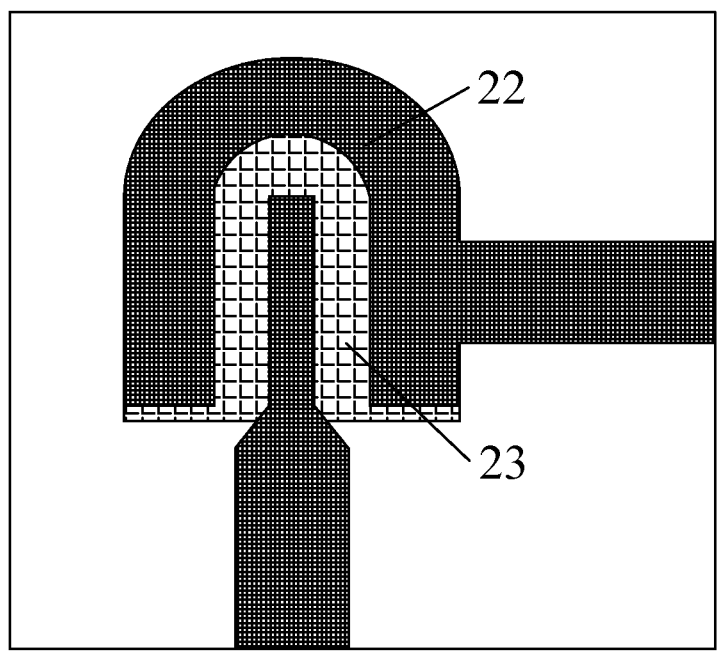
FIG. 1 is a schematic view showing a planar structure of a semi-transmissive mask for forming a source/drain and an active layer in an existing 4M process.
Figure 2:
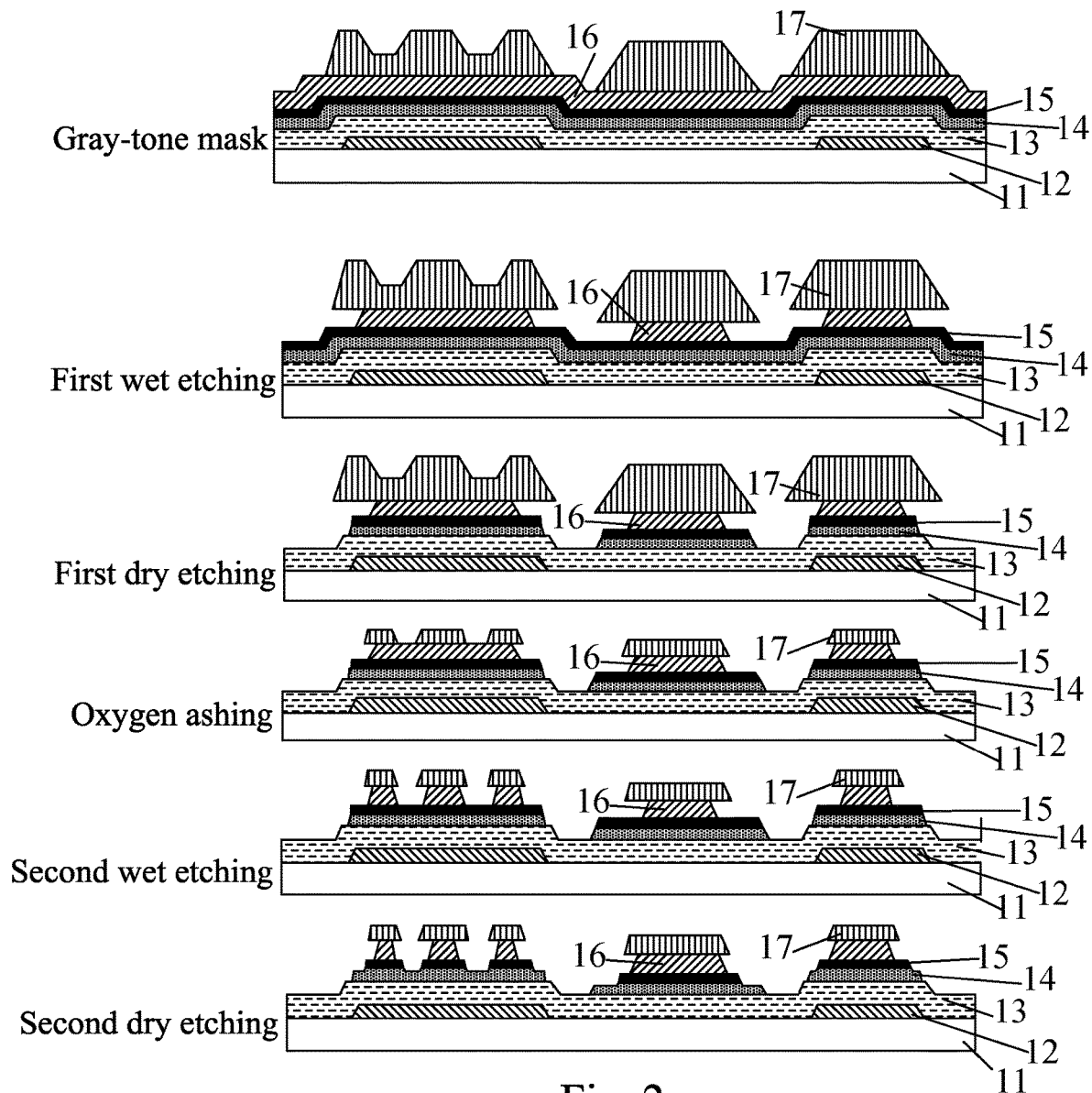
FIG. 2 is a schematic view showing a process of forming a source/drain and an active layer in an existing 4M process.
Figure 3:
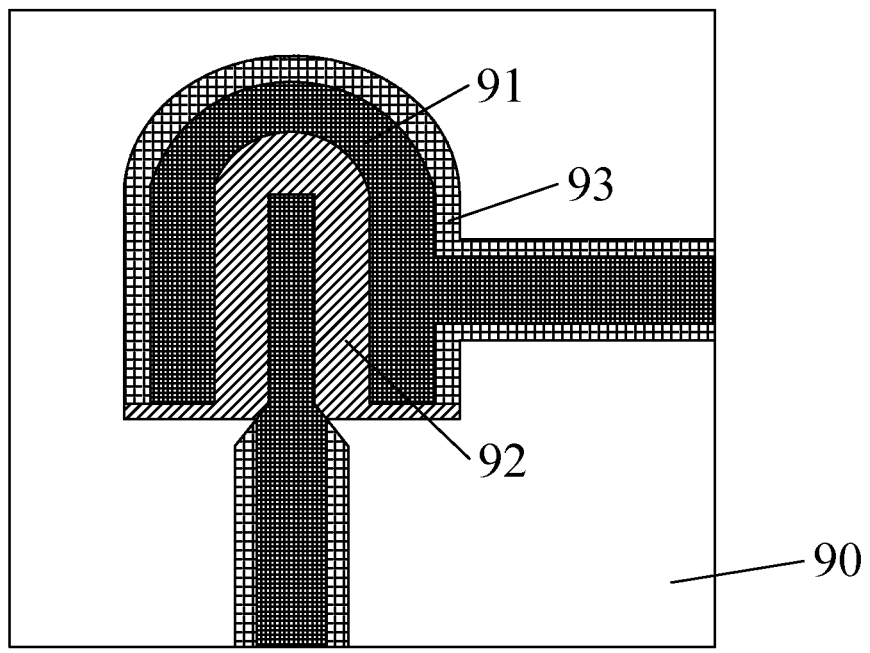
FIG. 3 is a schematic view showing a first planar structure of semi-transmissive mask used in a manufacturing method of TFT array substrate according to the present invention.
Figure 4:
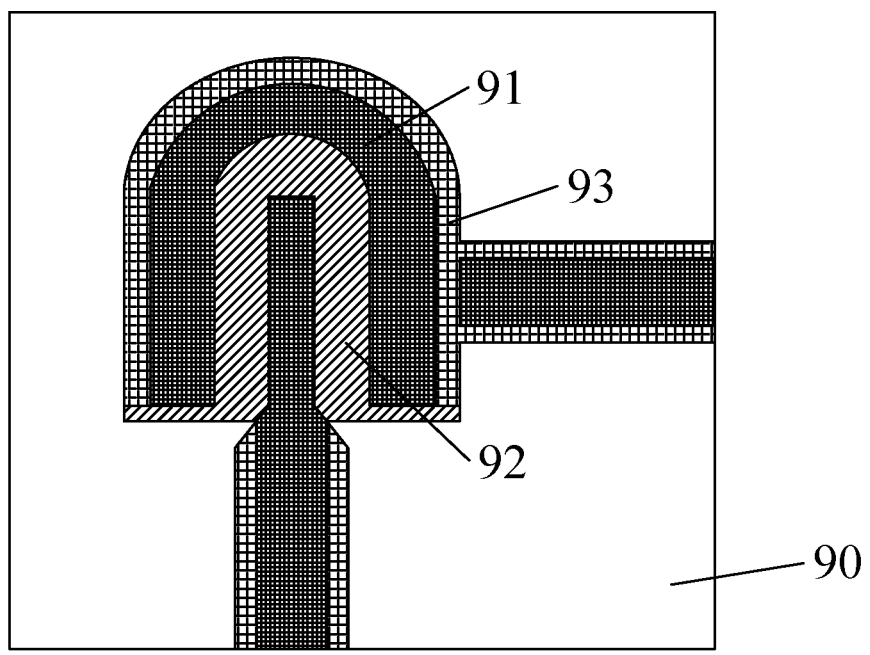
FIG. 4 is a schematic view showing a second planar structure of semi-transmissive mask used in a manufacturing method of TFT array substrate according to the present invention.

The main part for optimizing the existing process in the present invention is to reduce the thickness of the photoresist layer 80 for patterning the source/drain metal layer 50 and the semiconductor layer 40 by changing the structural design of the semi-transmissive mask 80. The edge portion 812 thins the edge of the photoresist layer 80, alleviating the problem of tailing of the active layer 45 at the edge of the source/drain 55. As shown in FIG. 3, a first planar structure of the semi-transmissive mask 80 of the present invention is still the opaque first pattern 91 corresponding to the junction of two adjacent photoresist strips forming the center portion 811 of the photoresist layer 80. As shown in FIG. 4, the portion of the semi-transmissive mask 90 of the second structure at the junction of two adjacent photoresist strips forming the center portion 811 of the photoresist layer 80 may also be a semi-transmissive edge pattern 93. By adjusting the process conditions when the first photoresist pattern 81 is formed, the first photoresist pattern 81 is still a connection structure at the junction. The semi-transmissive mask 90 specifically relates to the above two structures, but is not limited to the above two structures.

Specifically, the semi-transmissive mask 90 can adopt a gray-tone mask, and the light transmittance of the edge pattern 93 of the semi-transmissive mask 90 is 30%-50%. Alternatively, the semi-transmissive reticle 90 may also be a halftone mask.

Figure 5:
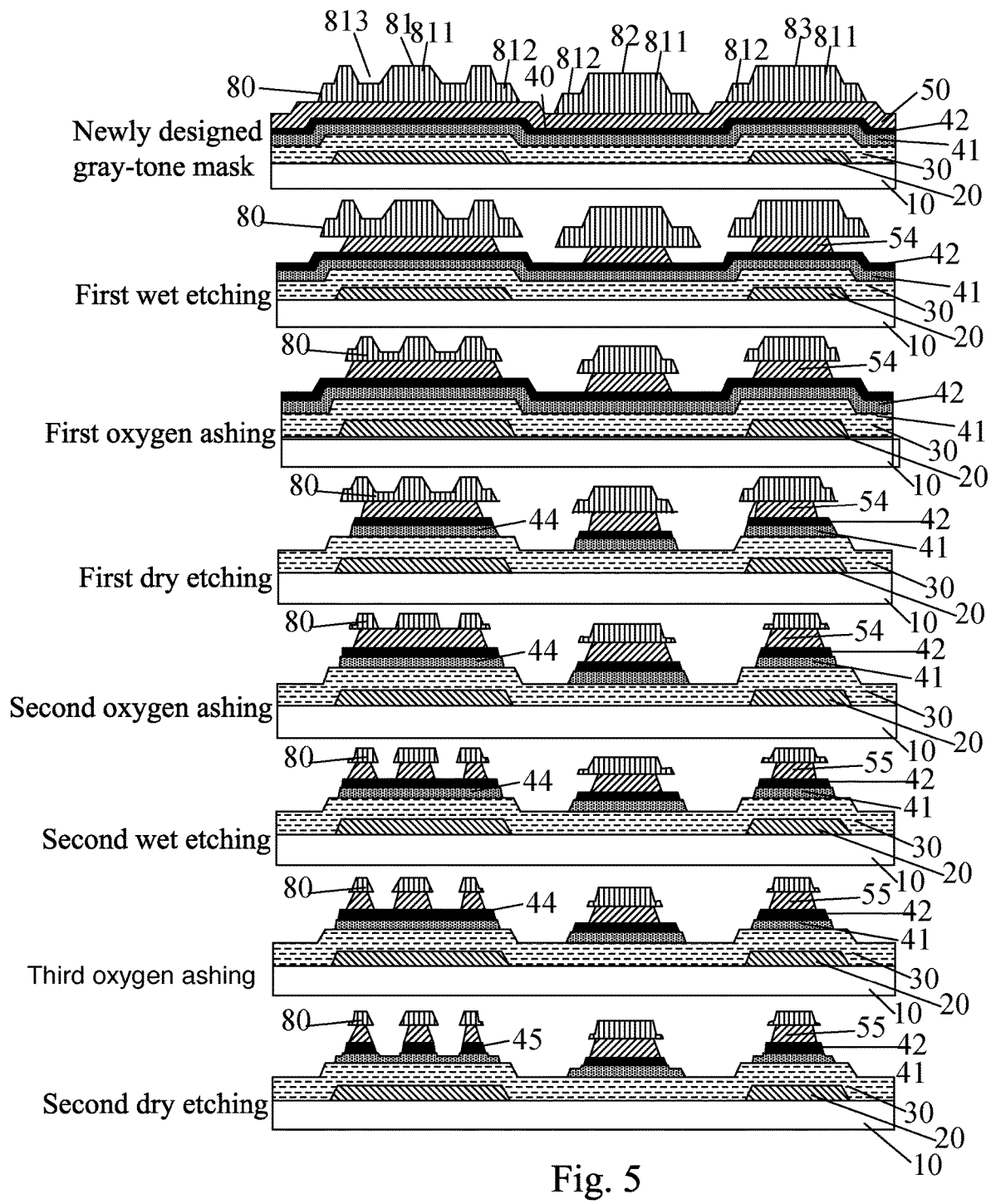
FIG. 5 is a schematic view showing a process for forming a source/drain and an active layer in a preferred embodiment of a manufacturing method of TFT array substrate according to the present invention.

FIG. 5 is a schematic view of a process for forming a source/drain and an active layer in a preferred embodiment of a manufacturing method of TFT array substrate according to the present invention, showing the second mask process; that is, the optimization performed by the present invention on the existing process. In step S1 of the first mask process before the second mask process, the gate 20 is deposited and patterned on the base substrate 10, and then the gate insulating layer 30, the semiconductor layer 40, and the source and drain layer are prepared. Then, the second mask process of step S2 to step S7 is performed in the application of the optimized gray-tone mask:

Step S2, providing a half-transmissive mask 90 of gray-tone mask, exposing and developing the photoresist material by using the semi-transmissive mask 90 to obtain a photoresist layer 80, the photoresist layer comprising a first photoresist pattern 81, a second photoresist pattern 82, and a third photoresist pattern 83, all continuously disposed; the first photoresist pattern 81, the second photoresist pattern 82, and the third photoresist pattern 83 each comprising a center portion 811 and an edge portion 812 on two sides of the center portion 811; the center portion 811 of the first photoresist pattern 81 being disposed with a groove 813; the edge portion 812 having a thickness smaller than the center portion 811; the center portion 811 corresponding to subsequently formed source/drain 55; the edge portion 812 corresponding to a subsequently formed semiconductor layer 40 at edge of metal wire structure 54; the groove 813 corresponding to a subsequently formed channel; that is, by changing the structural design of the half-transmissive mask 90, the edge of the photoresist layer 80 is thinned so that the width of the photoresist layer 80 is easily reduced in subsequent processes, thereby making the semiconductor layer 40 at the edge of the metal wire structure 54 easy to be dry etched by the plasma, reducing the problem of tailing of the active layer 45 at the edges of source/drain 55 to achieve a finer metal wire structure, and improve the optical stability and electrical performance of the TFT, aperture ratio, reliability, and power consumption, and the overall performance of the TFT array substrate. The residual problem of amorphous silicon and heavily doped silicon on the source/drain edge in the original process may be solved or reduced.

Step S3, performing a first wet etching, forming a metal wire structure 54 from the source/drain metal layer 50; then, performing ashing treatment on the photoresist layer 80.

Step S4, performing a first dry etching, forming an active layer structure 44 from the semiconductor layer 40. By performing ashing treatment on the photoresist layer after the first wet etching and before the first dry etching to reduce width of the photoresist layer 80, so that the semiconductor layer 40 at edge of the metal wire structure 54 is easily etched;

Step S5, performing ashing treatment on the photoresist layer 80 to reduce the thickness of the photoresist layer 80 such that the groove 813 is converted to a through hole which exposes an upper surface of the metal wire structure 514.

Step S6, performing a second wet etching, forming a source/drain 55 from the metal wire structure 54; then, performing ashing treatment on the photoresist layer 80.

Step S7: performing a second dry etching to form a channel on the active layer structure 44 to obtain an active layer 45 to form a TFT structure. By performing ashing treatment on the photoresist layer after the second wet etching and before the second dry etching to reduce the width of the photoresist layer, so that the semiconductor layer 40 at edge of the metal wire structure 54 is easily etched.

In summary, the manufacturing method of the TFT array substrate of the present invention is different from the existing 4M process by changing the structural design of the semi-transmissive mask for the photoresist layer for patterning the source/drain metal layer and the semiconductor layer. The edge forms a reduced thickness edge portion, so that the edge of the photoresist layer is thinned, and thereby the width of the photoresist layer is easily reduced in subsequent processes, and the semiconductor layer at the edge of the metal wire structure is easily etched during dry etching, reducing the problem of tailing of the active layer at the edges of source and drain to achieve a finer metal wire structure, and improve the optical stability and electrical performance of the TFT, aperture ratio, reliability, and power consumption, and the overall performance of the TFT array substrate. The residual problem of amorphous silicon and heavily doped silicon on the source/drain edge in the original process may be solved or reduced.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. A manufacturing method of thin film transistor (TFT) array substrate, comprising:
    Step S1: providing a base substrate, forming a gate, a gate insulating layer, a semiconductor layer, and a source/drain metal layer on the base substrate;
    Step S2: providing a half-transmissive mask, coating a photoresist material on the source/drain metal layer, exposing and developing the photoresist material by using the semi-transmissive mask to obtain a photoresist layer, the photoresist layer comprising a first photoresist pattern, a second photoresist pattern, and a third photoresist pattern spaced apart from each other; the first photoresist pattern, the second photoresist pattern, and the third photoresist pattern each comprising a center portion and an edge portion on two sides of the center portion; the center portion of the first photoresist pattern being disposed with a groove; the edge portion having a thickness smaller than the center portion; the center portion corresponding to subsequently formed source and drain; the edge portion corresponding to a subsequently formed semiconductor layer at edge of metal wire structure; the groove corresponding to a subsequently formed channel;
    Step S3: performing a first wet etching, forming a metal wire structure from the source/drain metal layer;
    Step S4: performing a first dry etching, forming an active layer structure from the semiconductor layer;
    Step S5: performing ashing treatment on the photoresist layer to reduce the thickness of the photoresist layer such that the groove is converted to a through hole which exposes an upper surface of the metal wire structure;
    Step S6: performing a second wet etching, forming a source and a drain from the metal wire structure; and
    Step S7: performing a second dry etching to form a channel on the active layer structure to obtain an active layer to form a TFT structure.

2. The manufacturing method of TFT array substrate as claimed in claim 1, wherein the semi-transmissive mask has a first pattern, a second pattern, and an edge pattern, wherein the second pattern is continuous with the first pattern, and the edge pattern is disposed continuously along an edge of the first pattern;
    in the step S2, the first pattern, the second pattern, and the edge pattern are respectively used to form the center portion, the groove, and the edge portion;
    the photoresist material provided in the step S2 is a positive photoresist material, the first pattern of the semi-transmissive mask is an opaque region, and the second pattern and the edge pattern are semi-transmissive regions.

3. The manufacturing method of TFT array substrate as claimed in claim 2, wherein the semi-transmissive mask is a halftone mask.

4. The manufacturing method of TFT array substrate as claimed in claim 2, wherein the semi-transmissive mask is a gray-tone mask, and the edge pattern of the semi-transmissive mask has a light transmittance of 30% to 50%.

5. The manufacturing method of TFT array substrate as claimed in claim 2, wherein the center portion of the photoresist layer formed in the step S2 has two or more connected photoresist strips, and a portion of the semi-transmissive mask where corresponding to the adjacent two photoresist strips are connected is a first pattern or edge pattern.

6. The manufacturing method of TFT array substrate as claimed in claim 1, wherein step S3 further comprises: performing ashing treatment on the photoresist layer after the first wet etching and before the first dry etching to reduce width of the photoresist layer, so that the semiconductor layer at edge of the metal wire structure is easily etched;
    the step S6 further comprises: performing ashing treatment on the photoresist layer after the second wet etching and before the second dry etching to reduce the width of the photoresist layer, so that the semiconductor layer at edge of the metal wire structure is easily etched.

7. The manufacturing method of TFT array substrate as claimed in claim 1, wherein the semiconductor layer comprises a channel layer and a contact layer disposed on the channel layer.

8. The manufacturing method of TFT array substrate as claimed in claim 7, wherein the channel layer and the contact layer are formed by plasma enhanced chemical vapor deposition, sol-gel, sputtering, or atomic layer deposition.

9. The manufacturing method of TFT array substrate as claimed in claim 7, wherein material of the channel layer and the contact layer is an amorphous silicon or a metal oxide semiconductor.

10. The manufacturing method of TFT array substrate as claimed in claim 1, wherein the TFT structure obtained in the step S5 is a TFT structure of an active area or a gate driver on array (GOA) area.

* * * * *